(12) United States Patent
Ogawa et al.

(10) Patent No.: US 11,646,214 B2
(45) Date of Patent: May 9, 2023

(54) SUBSTRATE STORAGE CONTAINER

(71) Applicant: Shin-Etsu Polymer Co., Ltd., Tokyo (JP)

(72) Inventors: Osamu Ogawa, Saitama (JP); Kiminori Tominaga, Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 604 days.

(21) Appl. No.: 16/494,451

(22) PCT Filed: Feb. 15, 2018

(86) PCT No.: PCT/JP2018/005296
§ 371 (c)(1),
(2) Date: Sep. 16, 2019

(87) PCT Pub. No.: WO2018/179964
PCT Pub. Date: Oct. 4, 2018

(65) Prior Publication Data
US 2020/0020549 A1 Jan. 16, 2020

(30) Foreign Application Priority Data

Mar. 27, 2017 (JP) .............................. JP2017-061813

(51) Int. Cl.
*H01L 21/673* (2006.01)
*F16K 27/02* (2006.01)
*H01L 21/677* (2006.01)

(52) U.S. Cl.
CPC ...... *H01L 21/6732* (2013.01); *F16K 27/0209* (2013.01); *H01L 21/67376* (2013.01); *H01L 21/67379* (2013.01); *H01L 21/67383* (2013.01); *H01L 21/67389* (2013.01); *H01L 21/67393* (2013.01); *H01L 21/67769* (2013.01)

(58) Field of Classification Search
CPC .......... H01L 21/67393; H01L 21/6732; H01L 21/67017; H01L 21/67389; H01L 21/02049; Y10S 414/137–139
See application file for complete search history.

(56) References Cited

U.S. PATENT DOCUMENTS 5,873,468 A * 2/1999 Ejima ............... H01L 21/67376
220/745
7,455,180 B2 * 11/2008 Sumi ................. H01L 21/67379
206/711
(Continued)

FOREIGN PATENT DOCUMENTS

JP 2011181930 A 9/2011
JP 2014160783 A 9/2014
(Continued)

Primary Examiner — Mollie Impink
(74) Attorney, Agent, or Firm — The Webb Law Firm

(57) ABSTRACT

A substrate storage container comprises a container body capable of containing a plurality of substrates, and an air supply member capable of supplying gas from outside of the container body to an internal space, wherein for the substrate storage container the container body is formed in a front open box and the air supply member is attached to the bottom surface, and wherein a functional unit that changes the environment of the internal space to different states are connected with the air supply member so as to be able to be exchanged.

6 Claims, 17 Drawing Sheets

(56) References Cited

U.S. PATENT DOCUMENTS

| | | | | |
|---|---|---|---|---|
| 10,312,122 B2* | 6/2019 | Ogawa | ............... | H01L 21/67389 |
| 2005/0115866 A1* | 6/2005 | Burns | ............... | H01L 21/67369 |
| | | | | 206/832 |
| 2005/0252827 A1 | 11/2005 | Tieben et al. | | |
| 2011/0114534 A1* | 5/2011 | Watson | ............... | H01L 21/67393 |
| | | | | 206/710 |
| 2016/0276190 A1* | 9/2016 | Smith | ............... | H01L 21/67393 |
| 2017/0213752 A1 | 7/2017 | Ogawa et al. | | |
| 2017/0271188 A1 | 9/2017 | Fuller et al. | | |

FOREIGN PATENT DOCUMENTS

| | | | | |
|---|---|---|---|---|
| JP | 20164949 A | 1/2016 | | |
| JP | 201615421 A | 1/2016 | | |
| JP | 2016538732 A | 12/2016 | | |
| WO | 2016013536 A1 | 1/2016 | | |
| WO | WO-2016013536 A1 * | 1/2016 | ......... | H01L 21/6732 |
| WO | 2016089912 A1 | 9/2016 | | |
| WO | 2016135952 A1 | 9/2016 | | |

\* cited by examiner

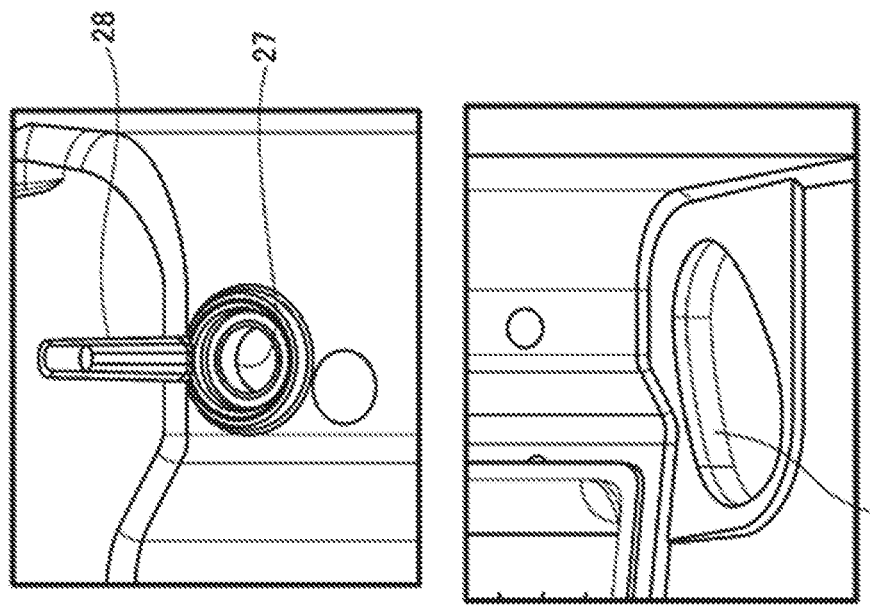
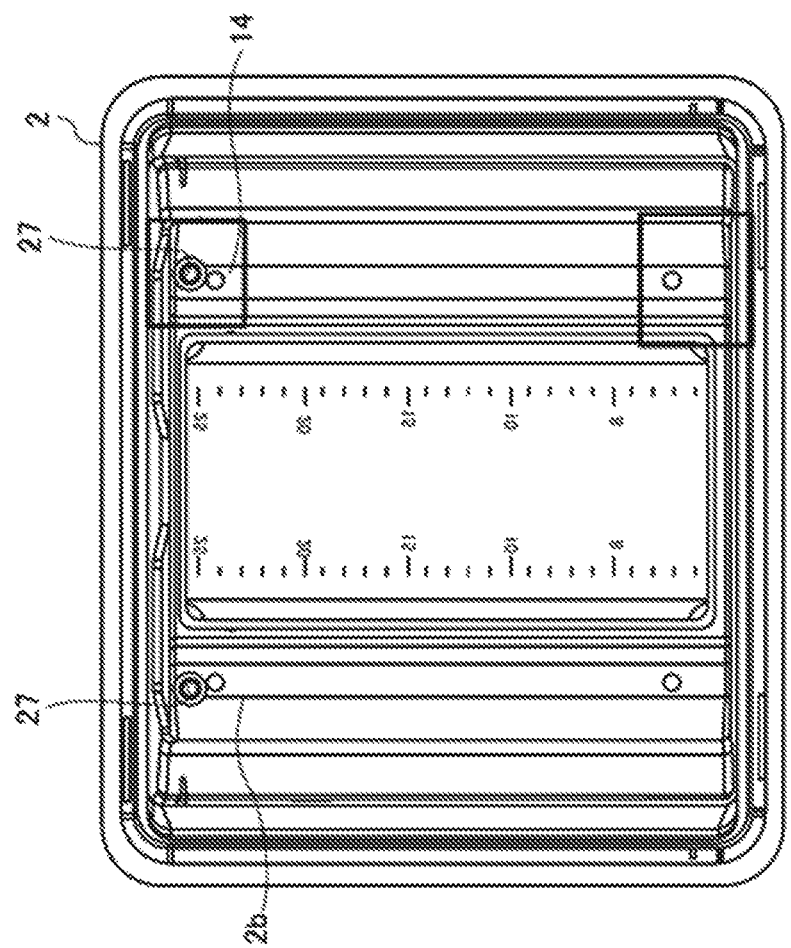

SUBSTRATE STORAGE CONTAINER

CROSS-REFERENCE TO RELATED APPLICATIONS

This application is the United States national phase of International Application No. PCT/JP2018/005296 filed Feb. 15, 2018, and claims priority to Japanese Patent Application No. 2017-061813 filed Mar. 27, 2017, the disclosures of which are hereby incorporated by reference in their entirety.

BACKGROUND OF THE INVENTION

Field of the Invention

The present invention relates to a substrate storage container for storing a plurality of substrates.

Description of Related Art

A substrate storage container stores substrates such as semiconductor wafers in an internal space and the container is used for storage in a warehouse, and used for transportation between semiconductor processing devices, factories, or the like. In the substrate storage container, the inner space may be replaced with an inert gas such as nitrogen gas or dry air so that the substrates stored in the inner space are not oxidized or contaminated.

Such a substrate storage container which includes a container body for storing a plurality of substrates, and a lid detachably fitted to the opening of the container body, an air supply member for supplying a gas from the outside of the container body to the internal space is fitted to the bottom plate of the container body, a hollow blowout nozzle (functional unit; gas replacement unit) communicating with the air supply member is provided vertically, and a peripheral wall of the blowout nozzle is provided with a blowout hole for blowing out gas toward the substrates is known (See Japanese Unexamined Patent Application No. 2016-004949 and Japanese Unexamined Patent Application No. 2016-015421).

However, in the substrate storage containers disclosed in Japanese Unexamined Patent Application No. 2016-004949 and Japanese Unexamined Patent Application No. 2016-015421, because the functional units are attached by screwing so that the container body is sandwiched between the functional units and the screwing members when replacing the functional unit, installation or removal work needs to be done on both the inside and the outside of the container body, and operability is poor.

SUMMARY OF THE INVENTION

Accordingly, this invention is made in view of the above problem, and an object of this invention is to provide a substrate storage container in which functional units that change an environment of the inner space can be easily replaced.

(1) According to the present invention an aspect comprises a substrate storage container comprising a container body capable of containing a plurality of substrates, and at least one air supply member capable of supplying gas from outside of the container body to an internal space, wherein for the substrate storage container the container body is formed in a front open box and the at least one air supply member is attached to a bottom surface, and wherein at least one functional unit that changes an environment of the internal space to different states are connected with the at least one air supply member so as to be able to be exchanged.

(2) According to the above aspect (1), wherein the at least one air supply member has a filter member that filters a gas.

(3) According to either aspects (1) or (2) above, wherein the at least one functional unit is a gas replacement unit comprising a housing member for storing the gas supplied from the air supply member, a cover member covering an opening of the housing member, and blowout holes for blowing out the gas formed in at least one of the housing member and the cover member.

(4) According to either aspects (1) or (2) above, wherein the at least one functional unit is a valve unit including a check valve that enables the gas to flow into the internal space.

(5) According to either aspects (1) or (2) above, wherein the at least one functional unit is a blocking unit that blocks the flow of the gas into the internal space.

(6) According to either aspects (1) or (2) above, wherein the at least one functional unit is a filter unit which includes a filter member that purifies the gas supplied to the internal space.

(7) According to any of aspects (1) to (6) above, wherein the gas is nitrogen gas or dry air.

According to the present invention, providing a substrate storage container in which functional units for changing the environment of the internal space can be easily replaced.

BRIEF DESCRIPTION OF DRAWINGS

FIG. 9A is front schematic view of the container body, FIG. 9B is an enlarged perspective view of an upper attachment portion of the gas replacement unit, and FIG. 9C is an enlarged perspective view of the lower attachment portion of the gas replacement unit.

DESCRIPTION OF THE INVENTION

Figure 1:
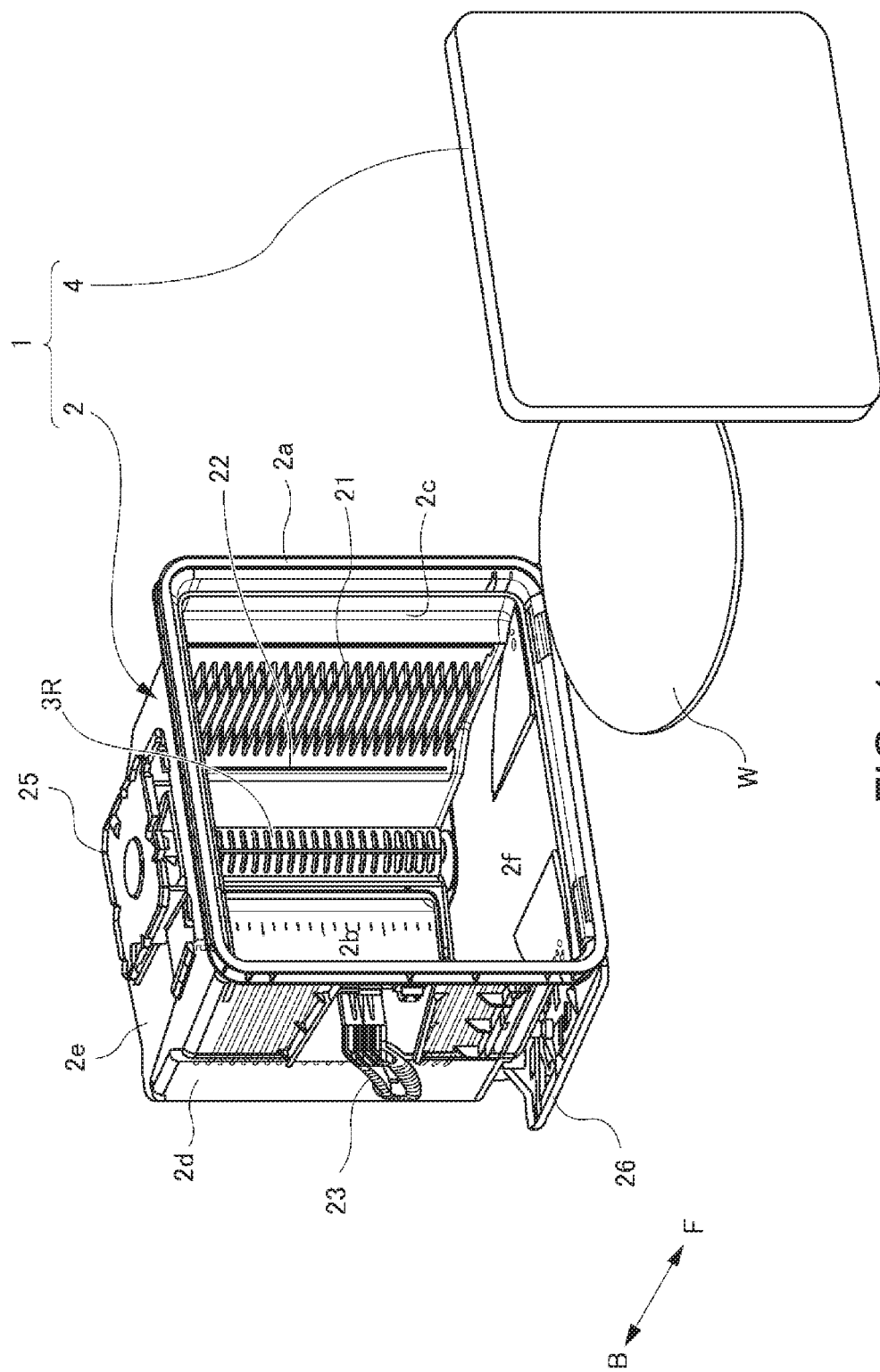
FIG. 1 is an exploded perspective view showing a substrate storage container according to an embodiment of the present invention.

Hereinafter, embodiments of the present invention will be described in detail with reference to the drawings. In the embodiments of the present specification, the same reference numerals are given to the same members throughout. In addition, in the drawings, the directions of front F and back (rear wall 2b) B are indicated by solid arrows. Moreover, the left and right refer to the state as seen from the front F.

Figure 2:
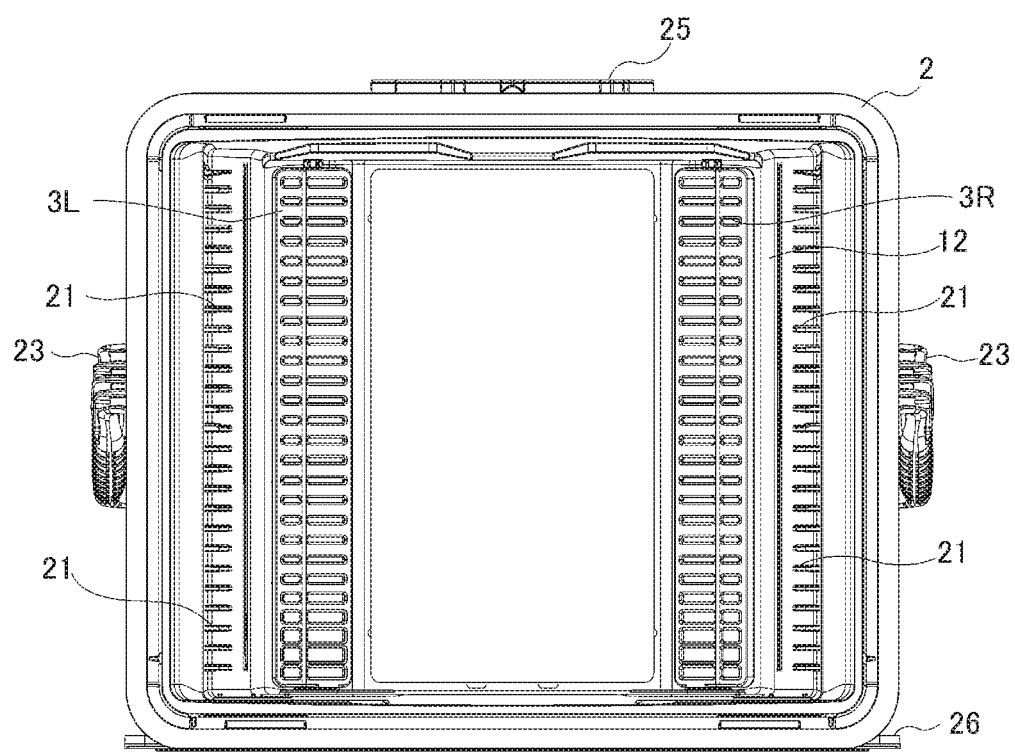
FIG. 2 is a front view of the container body.
Figure 3:
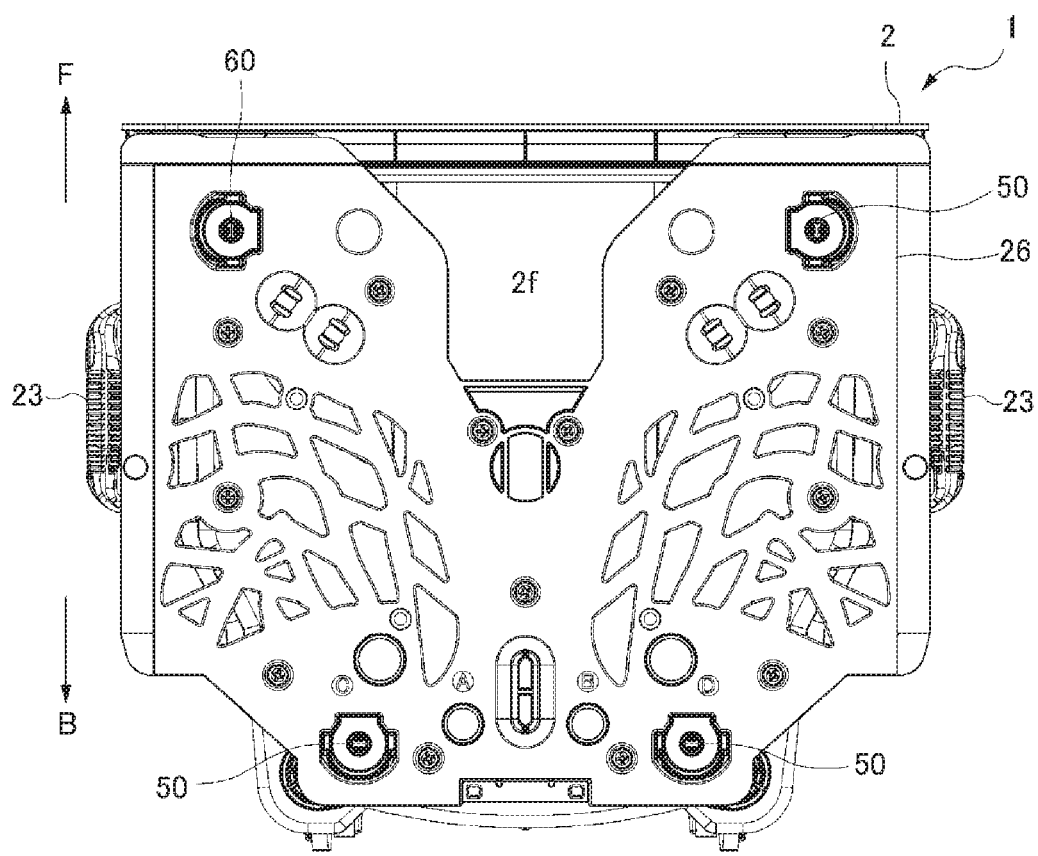
FIG. 3 is a bottom view of the container body.
Figure 4:
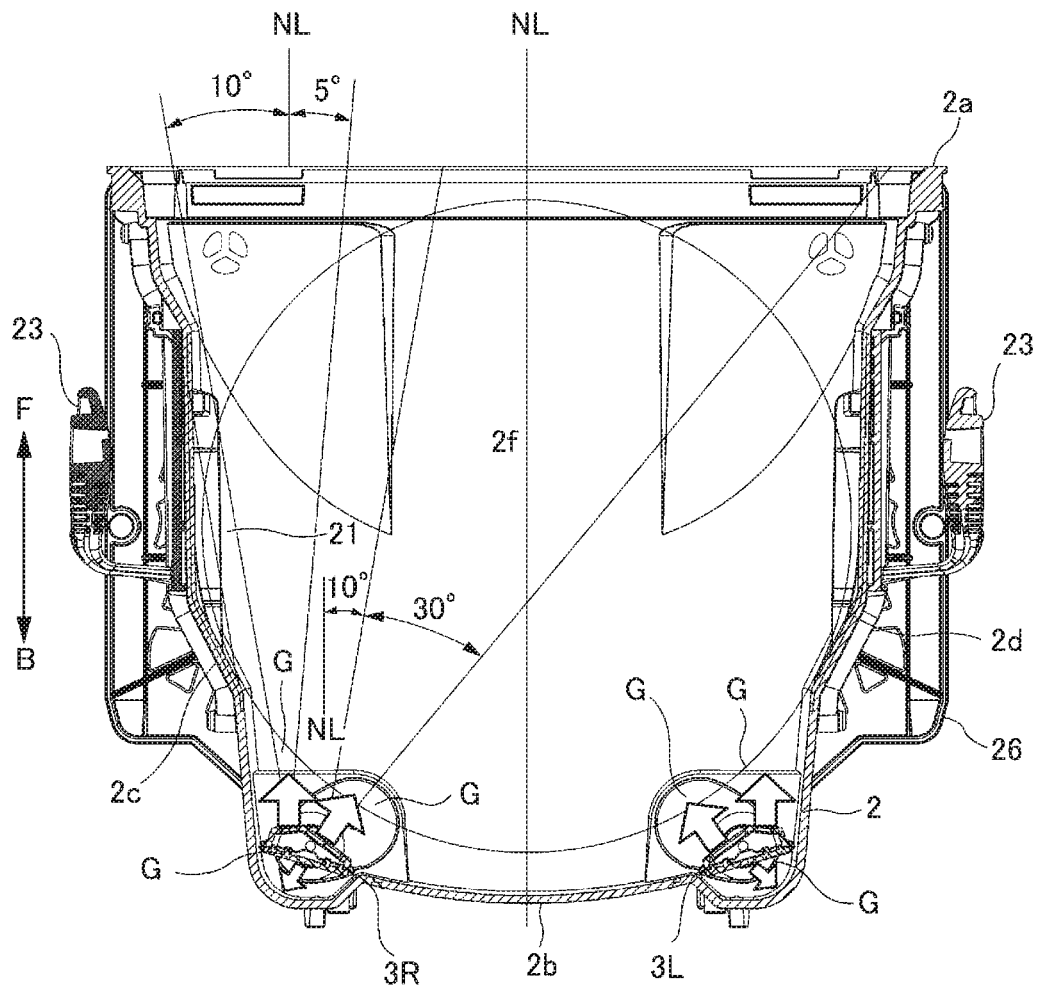
FIG. 4 is a sectional plan view of the container body.

The substrate storage container 1 will be described. FIG. 1 is an exploded perspective view of a substrate storage container according to an embodiment of the present invention. FIG. 2 is a front view of the container body; FIG. 3 is a bottom view of the container body, and FIG. 4 is a sectional plan view of the container body.

The substrate storage container 1 shown in FIG. 1 includes a container body 2 for storing a plurality of substrates W, and a lid 4 detachably mounted on the opening of the container body 2. Some examples of the substrates W that can be stored in the substrate storage container 1 include a semiconductor wafer having a diameter of 300 mm or 450 mm, a glass mask, or the like.

The container body 2 is a so-called front open box type formed by a front opening frame 2a, a rear wall 2b, a right side wall 2c, a left side wall 2d, a top surface 2e, and a bottom surface 2f.

Because the lid 4 is detachably attached to the opening of the front opening frame 2a of the container body 2, a sealing gasket (not shown) is attached so as to face the front opening frame 2a of the container body 2. When the lid 4 is attached to the container body 2, the sealing gasket is in close contact with the peripheral edge portion between the container body 2 and the lid 4, so as to maintain the airtightness of the internal space of the substrate storage container 1.

On the rear wall 2b of the container body 2, protrusions projecting towards the back B are formed on both the left and right sides (see FIG. 4). These protrusions function as leg portions when placed with the opening of the front F of the container body 2 facing upward. Further, on the central outer side of the rear wall 2b of the container body 2, a scale or the like indicating the number of substrates W that can be stored is displayed (see FIG. 1).

In the area of the centers of the outside right side wall 2c and the left side wall 2d of the container body 2, grips 23 that can be used for a gripping operation are respectively attached.

Also, a plurality of left and right pairs of support pieces 21 for horizontally supporting the stored substrates W are provided on the inside right side wall 2c and the left side wall 2d of the container body 2, and on the inner back B of the right side wall 2c and the left side wall 2d, position regulating portions 22 are provided for regulating the insertion position of the substrates W when the substrates W are inserted toward the back B.

The pairs of left and right support pieces 21 are arranged at a predetermined pitch in the vertical direction, and each support piece 21 is formed in an elongated plate shape for supporting the peripheral edges of the substrates W. In the present embodiment, the support pieces 21 are provided so as to be able to support 25 substrates W, but the maximum stored number of substrates W is not limited to 25.

Because the substrates W may be stored in a fully loaded state or a smaller number than the fully loaded state in the container body 2, the storage positions may be changed, as required, and the number stored and the storage state within the container body 2 depends on the usage of the substrate storage container 1. For example, a plurality of substrates W may be stored so as to be biased upward or downward or may be stored so as one is positioned in every other space.

A top flange 25 such as a robotic flange is attached to the outside of the top surface 2e of the container body 2. The top flange 25 is used for transportation between processes, such as when being gripped by an overhead conveying vehicle at a semiconductor manufacturing factory, and/or is used for positioning in a lid opening/closing device such as a semiconductor processing apparatus.

On the outside of the bottom surface 2f of the container body 2, a bottom plate 26 for positioning and placing the container body 2 is attached.

Parts such as the container body 2 and the lid 4, as well as the grip 23, the top flange 25, and the bottom plate 26 are injection-molded with a resin molding material, or a combination of a plurality of parts are injection molded. Examples of the resin contained in the molding material include thermoplastic resins such as polycarbonate, cyclo olefin polymer, polyether imide, polyether ketone, polyether ether ketone, polybutylene terephthalate, polyacetal, liquid crystal polymer, or alloys thereof.

In addition, conductive substances composed of carbon fibers, carbon powders, carbon nanotubes, conductive polymers or the like, or antistatic agents such as anions, cations, nonionic additives or the like can be added as required to these resins. Further, an ultraviolet absorber or a reinforcing fiber for improving the rigidity can be added as necessary. Note that, the container body 2, the lid 4, the grip 23, the top flange 25, the bottom plate 26, and the like may be transparent, opaque or translucent, but the container body 2 and the lid 4 are preferably transparent.

Here, as shown in FIG. 3, three air supply members 50 and one exhaust member 60 are provided on the bottom surface 2f of the container body 2. The air supply member 50 and the exhaust member 60 suppress the deterioration of the surfaces of the stored substrates W by circulating a gas G from outside of the substrate storage container 1 to the internal space or from the internal space to the outside, and functions to eliminate the pressure difference between the internal space of the substrate storage container 1 and the outside.

Of these, two air supply members 50 are provided on the left and right sides of the rear B of the bottom surface 2f, and in addition, one air supply member 50 and one exhaust member 60 are provided on the left or right of the bottom surface 2f near the front surface F. Then, various functional units U described later are connected with the air supply members 50 (see FIG. 13). Note that the air supply member 50 in the vicinity of the front face F may be used as the exhaust member 60.

Each air supply member 50 has a grommet 50a mounted in a recess formed in the bottom surface 2f of the container body 2, an air permeable filtration member 51 attached to an end portion of the grommet 50a, and a check valve 52. The grommet 50a is formed of an elastic resin member such as an elastomer. The filtration member 51 filters the supplied gas G so as to remove dust, and a nonwoven fabric filter or the like may be used.

The check valve 52 is biased by a coil spring 53 in the direction of closing the valve, and is stored in a valve housing 54. Note that for the present embodiment, although each of the air supply members 50 have a check valve 52, a check valve 52 may not be provided depending on the type of functional unit U described later.

Furthermore, the exhaust member 60 has a check valve (not shown), and for example, by attaching a humidity (or concentration) sensor, the humidity (or concentration) of the internal space of the substrate storage container 1 after replacing the internal space of the substrate storage container 1 with the gas G is able to be measured, and managing whether the replacement of the gas G in the internal space of the substrate storage container 1 has been performed normally is also possible.

Figure 13:
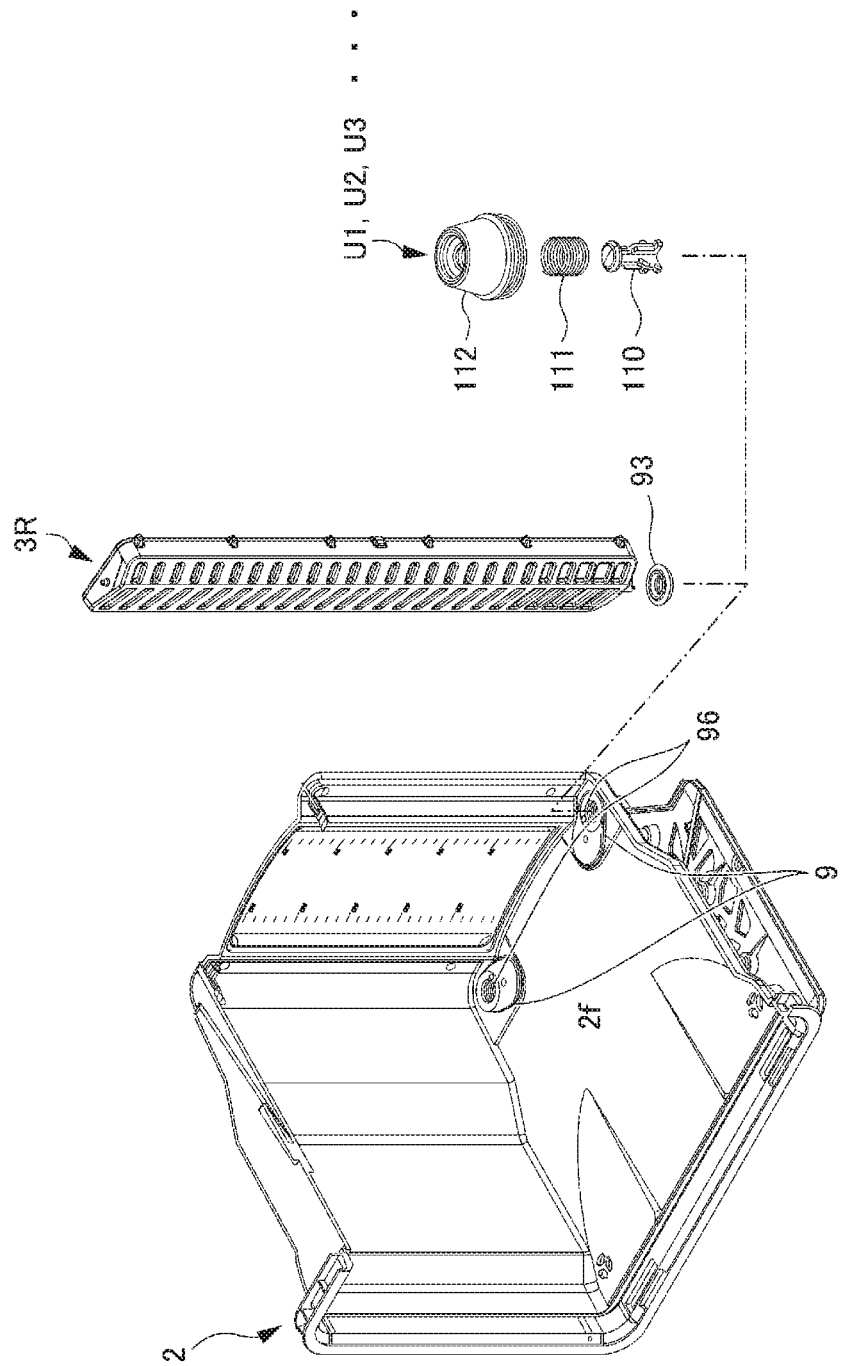
FIG. 13 is a schematic view illustrating various replaceable functional units.

Next, configurations of various functional units U for changing the environment of the internal space of the substrate storage container 1 will be described in order. FIG. 13 is a schematic view for explaining various replaceable functional units U.

Examples of the functional unit U include gas replacement units 3R and 3L, a valve unit U1, a closing unit U2, a small diameter filter unit U3, a large diameter filter unit U4, and the like.

(Gas Replacement Unit 3R, 3L)

Figure 5:
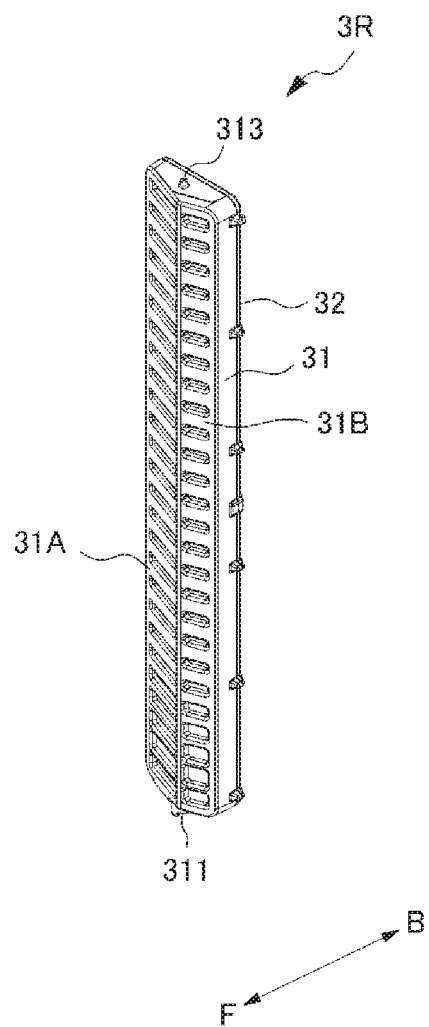
FIG. 5 is a perspective view of a gas replacement unit.
Figure 6:
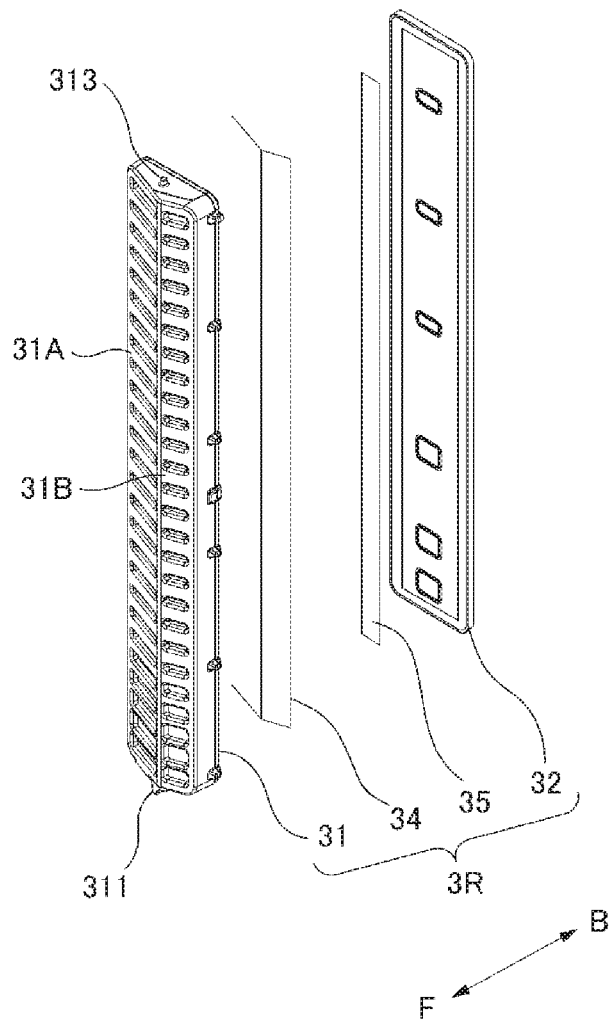
FIG. 6 is an exploded perspective view of the gas replacement unit.
Figures 7A, 7D:
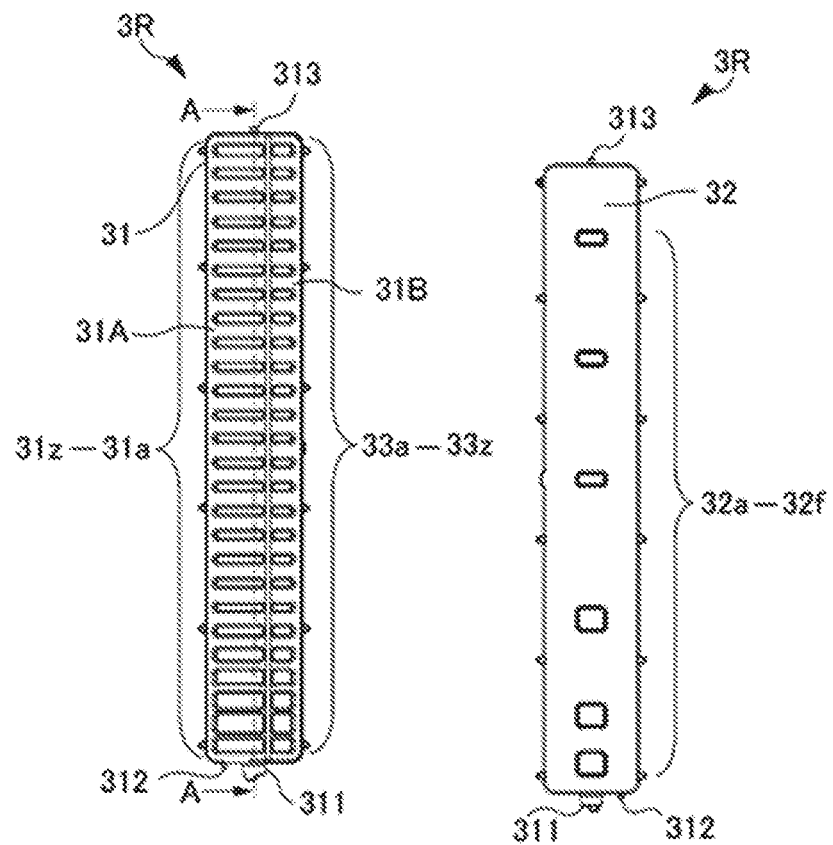
FIG. 7A is a front view.
FIG. 7D is a rear view of the gas replacement unit.
Figure 7B:
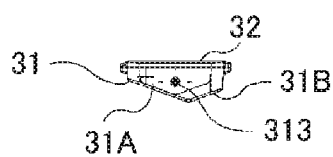
FIG. 7B is a plan view.
Figure 7C:
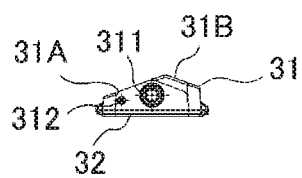
FIG. 7C is a bottom view.
Figure 8:
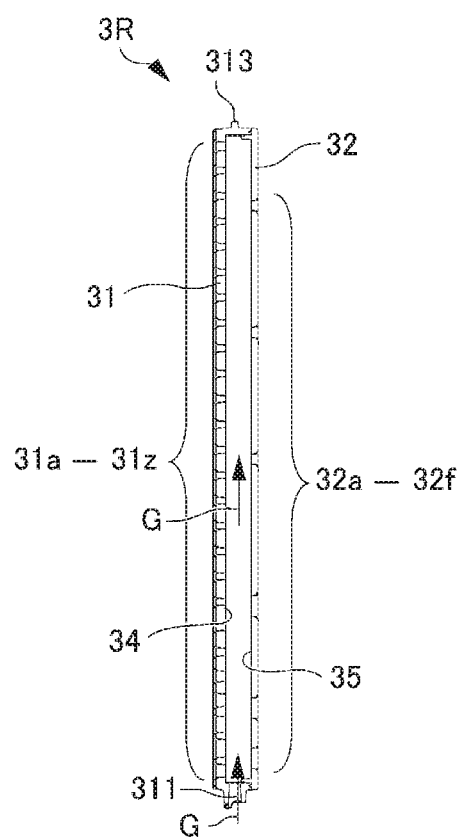
FIG. 8 is a sectional view taken along the line AA in FIG. 7A of the gas replacement unit.

First, a structure in which the internal space of the substrate storage container 1 is replaced with a gas G by the gas replacement units 3R, 3L will be described. FIG. 5 is a perspective view of the gas replacement unit 3R,3L, and FIG. 6 is an exploded perspective view of the gas replacement unit 3R,3L. FIG. 7A is a front view, FIG. 7B is a plan view, FIG. 7C is a bottom view, and FIG. 7D is a rear view of the gas replacement unit 3R,3L. FIG. 8 is a cross-sectional view taken along the line AA in FIG. 7A of the gas replacement unit 3R,3L. Note that FIGS. 5 to 8 show the gas replacement unit 3R on the right side as viewed from the front F.

Because the gas replacement units 3R and 3L replace the internal space of the container body 2 with a gas G, the units are provided vertically in the longitudinal direction on both the left and right sides at the back B (near the rear wall 2b or the projecting portion) of the container body 2 so as to not interfere with the substrates W even when the substrates W are inserted (See FIGS. 1 and 2).

The gas replacement units 3R and 3L blow the gas G into the internal space of the container body 2. The gas G to be blown in may be an inert gas or dry air. Further, examples of the inert gas include nitrogen gas, argon gas or the like, but from a cost perspective, nitrogen gas is preferable.

The gas replacement units 3R and 3L will be described in more detail. However, as shown in FIG. 2, because the gas replacement unit 3L has the same shape and structure, except that it is bilaterally symmetrical with the gas replacement unit 3R, its explanation will be omitted.

The gas replacement unit 3R shown in FIG. 5 includes a housing member 31 and a cover member 32 and is formed in a substantially pentagonal prism shape, but the shape is not limited thereto. Further, the gas replacement unit 3R may be formed of the same resin such as that of the container body 2, or may be formed of a different resin.

The housing member 31 is formed in a box shape in which one side is open in order to store the gas G, and the cover member 32 is attached by a locking means (engaging means) such as a hook or the like so as to cover the open surface. A space for storing the gas G is formed by the housing member 31 and the cover member 32.

Here, the housing member 31 has two surfaces 31A, 31B of different sizes and the surfaces intersect at a predetermined angle. The intersection angle between the surface 31A and the surface 31B is in the range of 120° to 170° in the interior angle. Further, the area of the surface 31A is larger than the area of the surface 31B.

A cylindrical connecting member 311, into which the gas G from the air supply member 50 flows, protrudes from the lower surface of the housing member 31. In the vicinity of the connecting member 311, a rotation stopping protrusion 312, for positioning the rotational direction, is formed which stops the rotation of the gas replacement unit 3R in the left-right direction (See FIG. 7). On the other hand, a cylindrical positioning protrusion 313 is formed on the upper surface of the housing member 31 for positioning and fixing to the container body 2.

As shown in FIG. 7A, on the surface 31A of the housing member 31, twenty-six horizontal elongated substantially rectangular blowout holes are formed as a first group of blowout holes $31a$, $31b$, $31c$ . . . $31x$, $31y$, $31z$ (hereinafter referred to as "first group blowout holes $31a$-$z$" as necessary) in the vertical direction (longitudinal direction) in order from the top.

On the surface 31B of the housing member 31, twenty-six horizontal elongated substantially rectangular blowout holes are formed as a third group of blowout holes $33a$, $33b$, $33c$ . . . $33x$, $33y$, $33z$ (hereinafter referred to as "third group blowout holes $33a$-$z$" as necessary) in the vertical direction (longitudinal direction) in order from the top.

By forming the first group blowout holes $31a$-$z$ and third group blowout holes $33a$-$z$ on the surfaces 31A and 31B, respectively, which intersect at a predetermined angle, the gas G can be blown in differently, and the gas G easily diffuses into the internal space of the substrate storage container 1.

The opening height of the uppermost first group blowout hole $31a$ is slightly larger than the opening height of the second first group blowout hole $31b$; that is, the opening area of first group blowout hole $31a$ is slightly larger than the opening area of first group blowout hole $31b$. Furthermore, the opening areas of the first group blowout hole $31b$ to the first group blowout hole $31u$ are all equal; the opening areas of the first group blowout hole $31v$ to the first group blowout hole $31y$ gradually become larger than the first group blowout hole $31u$; and the opening area of the first group blowout hole $31z$ is smaller than the opening area of first group blowout hole $31y$. The same applies to the third group blowout holes $33a$-$z$.

Then, the lowermost first group blowout hole $31z$ and third group blowout hole $33z$ are located lower than the substrates W supported by the lowermost support piece 21 of the container body 2. However, the number of holes like the first group blowout holes $31z$ and the third group blowout holes $33z$ that are below the lowermost substrate W are not limited to one but may be multiple.

In this way, because the first group blowout holes $31a$-$z$ and the third group blowout holes $33a$-$z$ each have a larger opening area on the lower side, then even if the straightness of the gas G supplied from below is high, the gas G is still uniformly blown from the lower side to the upper side of the first group blowout holes $31a$-$z$ and the third group blowout holes $33a$-$z$. Also, because the first group blowout hole $31z$ and the third group blowout hole $33z$ are also formed under the lowermost substrate W, and since the gas G is also blown out between the lowermost substrate W and the bottom surface $2f$, then even if any downflow air in the clean room intrudes into the inside from the opening at the front F of the container body 2, the downflow air in the clean room does not flow more than necessary due to the gas G being blown toward the front F over the upper surface of the bottom surface 2f.

Moreover, as shown in FIG. 7D, in the cover member 32, six substantially rectangular or square blowout holes are formed as a second group of blowout holes 32a, 32b . . . 32e, 32f (hereinafter referred to as "second group blowout holes 32a-f", as necessary) in the vertical direction in order from the top. The height position of the uppermost second group blowout hole 32a is substantially the same as the height position of the first group blowout hole 31c. Hereinafter, the second group blowout hole 32b and the first group blowout hole 31h coincide with each other at substantially the same height. The second group blowout hole 32c and the first group blowout hole 31m coincide with each other at substantially the same height. The second group blowout hole 32d and the first group blowout hole 31s coincide with each other at substantially the same height. The second group blowout hole 32e and the first group blowout hole 31w coincide with each other at substantially the same height. The second group blowout hole 32f and the first group blowout hole 31y coincide with each other at substantially the same height.

Here, the ratio of the total opening area S1, S2, S3 for each of the first group blowout holes 31a-z, second group blowout holes 32a-f, and third group blowout holes 33a-z can be adjusted so that variations in humidity decreases among the plurality of substrates W stored in the container body 2. By adjusting the blowout holes of the first group blowout holes 31a-z, the second group blowout holes 32a-f, and third group blowout holes 33a-z which are provided in the housing member 31 and the cover member 32 in a different manner or by closing any appropriate blowout holes, the opening area can be adjusted.

Returning to FIG. 4, since the gas replacement units 3R, 3L are provided on the left and right sides at the back B (the rear wall 2b or the vicinity of the protrusions) of the container body 2 as described above, in order to uniformly diffuse the discharged gas G into the internal space of the substrate storage container 1, essentially, the gas is blown out from the first group blowout holes 31a-z and the third group blowout holes 33a-z toward the front F, and the air will then be replaced with gas G. At this time, since there is air also from the rear wall 2b to the right side wall 2c or the left side wall 2d behind the position where the first group blowout holes 31a-z and the third group blowout holes 33a-z are provided, the gas G is preferably blown out from the second group blowout holes 32a-f toward the back B.

The space on the front F where the first group blowout holes 31a-z and the third group blowout holes 33a-z are provided is considerably larger than the space at the back B where the first group blowout holes 31a-z and the third group blowout holes 33a-z are provided; thereby, with respect to the total opening area S1 of the first group blowout holes 31a-z and the total opening area S3 of the third group blowout holes 33a-z facing the front F, making them larger than the total opening area S2 of the second group blowout holes 32a-f facing the back B is preferable.

In addition, as described above, the gas replacement units 3R and 3L basically blow the gas G toward the front F, but are provided in the vicinity of the right side wall 2c or the left side wall 2d; thereby, the amount of gas G directed to the front F along the right side wall 2c or the left side wall 2d may be small; however, the gas G directed toward the center of the container body 2 may be larger. Therefore, making the total opening area S1 of the first group blowout holes 31a-z larger than the total opening area S3 of the third group blowout holes 33a-z is preferable.

Based on this, the ratio of the total opening area of S1, S2, and S3 for each of the first group blowout holes 31a-z, the second group blowout holes 32a-f, and the third group blowout holes 33a-z, respectively, may be S1:S2:S3=3:1:2, or the like.

Returning to FIG. 6, an air permeable filter member is provided inside the housing member 31, and similarly, inside the cover member 32, an air permeable filter member 35 is also provided. Examples of the filter members 34, 35 include a nonwoven fabric filter or the like.

Then, the gas G is introduced via the cylindrical connecting members 311 into the space formed by the housing member 31 and the cover member 32, and is stored. The stored gas G passes through the filter members 34, 35, and is blown out from the first group blowout holes 31a-z, the second group blowout holes 32a-f, and the third group blowout holes 33a-z into the internal space of the container body 2.

Figure 10:
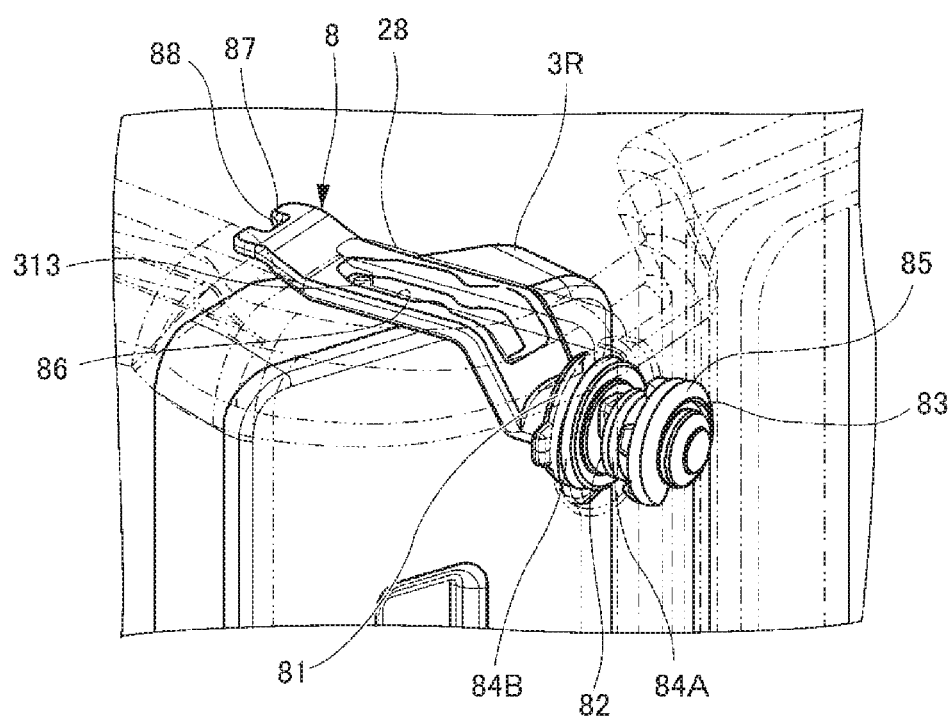
FIG. 10 is an enlarged perspective view of an upper attachment portion of the gas replacement unit.
Figure 11A:
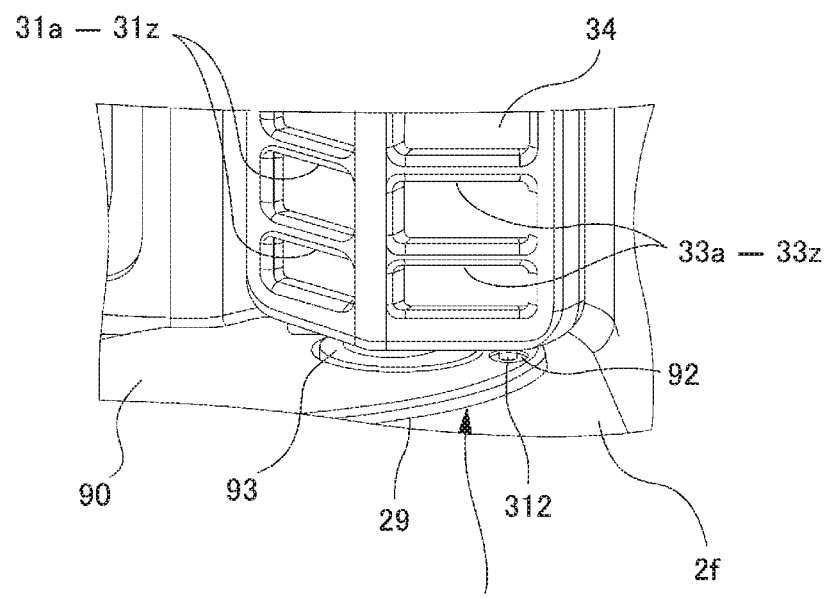
FIG. 11A is an enlarged view of a lower attachment portion of a gas replacement unit, and FIG. 11B a cross-sectional perspective view.
Figure 11B:
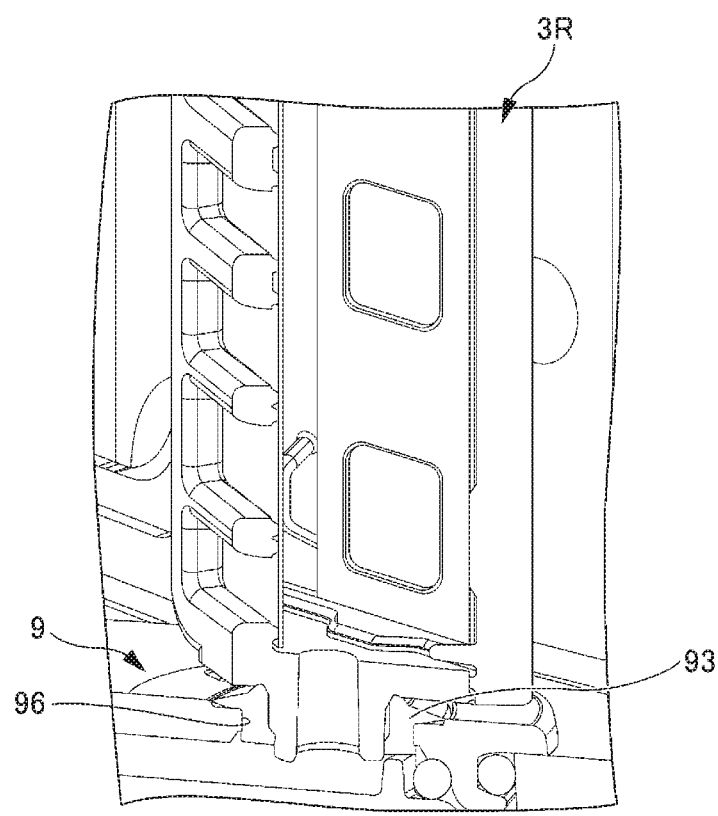

A method of attaching the gas replacement unit 3R to the container body 2 will be described. FIG. 9A is a schematic front view of the container body 2, FIG. 9B is an enlarged perspective view of the upper attachment portion of the gas replacement unit 3R, and FIG. 9C is an enlarged perspective view of the lower attachment portion of the gas replacement unit 3R. FIG. 10 is an enlarged perspective view of an upper attachment portion of the gas replacement unit 3R. FIG. 11A is an enlarged view of a lower attachment portion of a gas replacement unit 3R, and FIG. 11B is a cross-sectional perspective view.

The gas replacement unit 3R is attached to the container body 2 by a position fixing member 8 and an offset member 9. Specifically, the upper portion of the gas replacement unit 3R is attached to the position fixing member 8, and the lower portion of the gas replacement unit 3R is attached to the offset member 9.

Therefore, circular through holes 27 are formed in the left and right sides of the rear wall 2b of the container body 2 in order to fix the position fixing member 8, and also a stopper 28 is formed above the through hole 27. On the other hand, attachment holes 29 are formed on the left and right sides of the bottom surface 2f of the container body 2 in order to fix the offset member 9. The attachment holes 29 are formed in a substantially elliptical shape instead of a circular shape by connecting a large circle and a small circle.

The position fixing member 8 shown in FIG. 10 has an elongated shape, one end side of which is formed in a substantially plate shape and the other end side thereof is formed by a rectangular shaft. Three disk-shaped flanges 81, 82, 83 are formed toward the other end side around this shaft. The shaft end flange 83 and the middle flange 82 are smaller than the diameter of the through hole 27 in the rear wall 2b and are inserted into the through hole 27. A small-diameter stepped portion is formed in the middle flange 82, and an O-ring 84A is fitted therein. A small-diameter stepped portion is also formed in the inner flange 81, and an O-ring 84B is fitted therein. The inner flange 81 and the O-ring 84B are formed larger than the diameter of the through hole 27, and when the other end side of the position fixing member 8 is inserted into the through hole 27, since the O-ring 84B is sandwiched between the container body 2 and the flange 81, the gas G does not leak out.

After inserting the position fixing member 8 into the through hole 27, a rectangular shaft is positioned between the shaft end flange 83 and the container body 2 with a C-ring 85 inserted in between and in which the inner surface of the C-ring forms a rectangular shape and its outer diameter is larger than the through hole 27; the position fixing member 8 is fixed to the container body 2 through the through hole 27. Specifically, sealing is enhanced by inserting the C-ring 85 while squashing the O-ring 84B between the flange 81 and the container body 2 and while pulling the shaft end flange 83 toward the outside.

Further, one end of the position fixing member 8 has a plate shape bent upward, and an elongated slit 86 is formed. The positioning protrusion 313 and the stopper 28 of the housing member 31 are fitted into the slit 86. The end 87 is further curved toward the top, and a U-shaped notch 88 is further formed at the tip thereof.

In the offset member 9 shown in FIG. 11, an offset offset plate presser 90 positioned inside the bottom surface 2f and an offset plate 95 positioned outside the bottom surface 2f are assembled via an O-ring 94 so that a gap through which the gas G can flow is formed between them.

The offset plate presser 90 is formed with a recess into which the rotation stopping protrusion 312 of the housing member 31 fits, and when the rotation stopping protrusion 312 fits into the recess 92, the direction and position of the rotating gas replacement unit 3R are fixed. An insertion hole 96 into which the connection tool 311 of the gas replacement unit 3R is inserted is formed in the offset plate presser 90, and the connector 311 is inserted into the insertion hole 96 through the packing 93. In the attachment hole 29, the offset plate presser 90 is fitted via an O-ring 91.

A concave portion into which the air supply member 50 is fitted is formed in the offset plate 95 so that the center of the air supply member 50 is located at a position displaced from the center position of the packing 93 as seen in the plan view.

With such a configuration, in the gas replacement unit 3R, the lower connecting member 311 is first attached to the offset member 9, and thereafter, the upper positioning protrusion 313 is attached to the position fixing member 8 and attached to the container body 2.

More specifically, because the connecting member 311 at the lower portion of the gas replacement unit 3R is inserted into the packing 93 and inclined, by pushing the positioning protrusion 313 on the upper portion of the gas replacement unit 3R from the end 87 toward the slit 86, the position fixing member 8 curves, and the positioning protrusion 313 fits into the slit 86. At the same time, the positioning protrusion 313 also comes into contact with the stopper 28, so that its position in the slit 86 is fixed, and the upper portion of the gas replacement unit 3R is fixed in a position.

Figure 12:
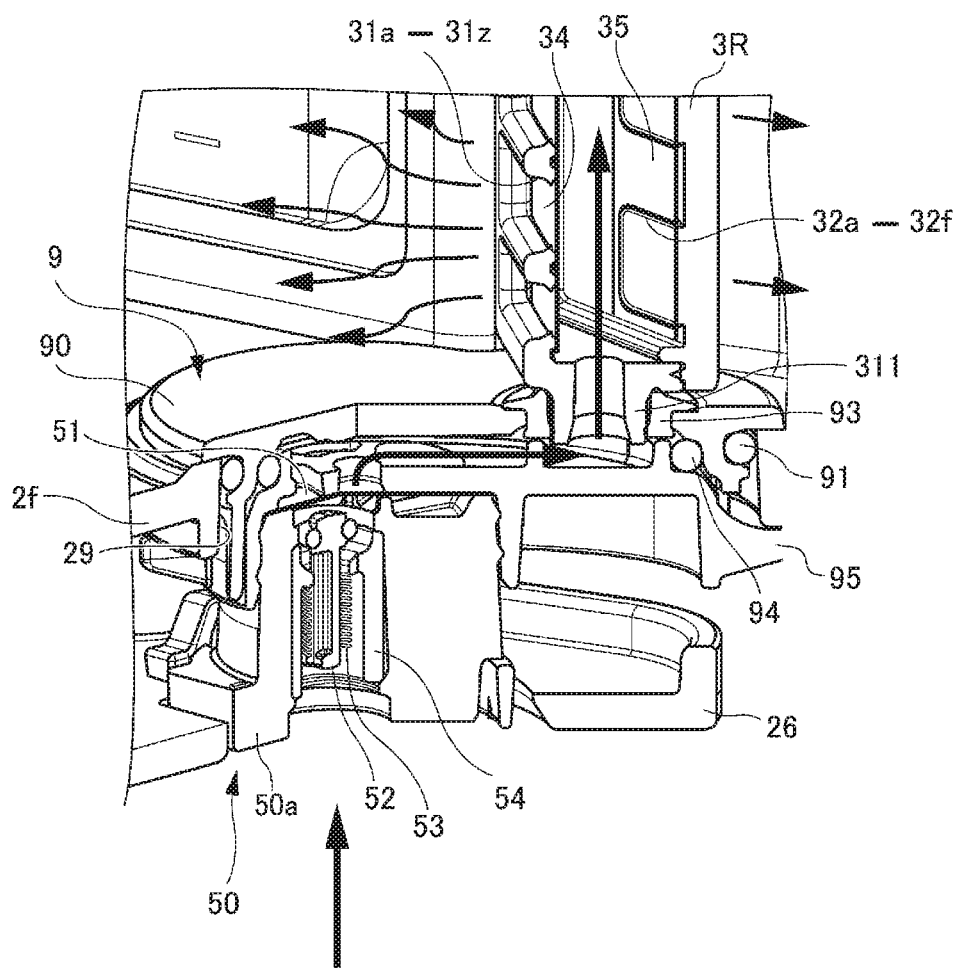
FIG. 12 is a cross-sectional perspective view showing the flow of gas that has flowed in from the air supply member.

The flow of the gas G will be described. FIG. 12 is a cross-sectional perspective view showing the flow of the gas G flowing from the air supply member 50.

The flow of the gas G is indicated by arrows. In FIG. 12, the gas G which is introduced at a high pressure from the air supply member 50 passes through the filtration member 51, and flows through the gap between the offset plate presser 90 and the offset plate 95, and is directed to the connection portion between the offset plate presser 90 at the back B and the connecting member 311 at the lower portion of the gas replacement unit 3R.

Thereafter, the gas G is blown out from the first group blowout holes 31a-z, the third group blowout holes 33a-z and the second group blowout holes 32a-f while advancing into the storage space of the gas replacement unit 3R (see FIG. 8). At this time, the gas G is blown out in three different directions, i.e. in the direction toward the center of the front F, in the direction toward the right side wall 2c and in the direction toward the rear wall 2b at the back B (see FIG. 4).

Here, the direction of the gas G blown out from the first group blowout holes 31a-z toward the vicinity of the center on the front F side of the container body 2, and the direction of the gas G blown out from the third group blowout holes 33a-z toward the right side wall 2c or the left side wall 2d of the container body 2 will be specifically described.

The advancing direction of the blowout openings of the first group blowout holes 31a-z or the third group blowout holes 33a-z, i.e. the normal line passing through the center of the surface 31A or the surface 31B where the first group blowout holes 31a-z or the third group blowout holes 33a-z are formed does not intersect with the right side wall 2c or the left side wall 2d and is preferably in a range reaching the opening of the front opening frame 2a of the container body 2. More preferably, in the case of the gas replacement unit 3R, the normal line to the surface 31A is in the range of 10° to 40° with respect to the normal line NL (perpendicular) from the opening of the front opening frame 2a of the container body 2, and the normal line of the surface portion 31B is in the range of 5° from the center side to 10° on the right side wall 2c, with the normal line NL (perpendicular) from the opening of the front opening frame 2a of the container body 2 therebetween. In the case of the gas replacement unit 3L, it is symmetrical with the gas replacement unit 3R.

The surface 31A and the surface 31B (or the first group blowout holes 31a-z and the third group blowout holes 33a-z) are formed so as to be within such a range, and by arranging the gas replacement units 3R, 3L inside the container body 2, the gas G blown out from the respective blowout holes does not collide with the right side wall 2c or the left side wall 2d of the container body 2 to be reflected. Therefore, since turbulence does not occur in the gas flow of the gas G, it is possible to quickly and reliably replace the internal space of the container body 2 with the gas G.

When the lid 4 is attached to the container body 2, the gas G is supplied to the container body 2 at a high pressure, and when the interior space is filled, the gas G flows out of the container body 2 from the exhaust member 60 shown in FIG. 3. Due to this outflow of air, the internal space of the substrate storage container 1 is replaced with the gas G which is a purge gas.

On the other hand, when the lid 4 is not attached, downflow air from an external device such as a clean room (not shown) flows in from the front F of the container body 2, but the internal space of the substrate storage container 1 is replaced with the gas G which is a purge gas while resisting this air.

(Valve Unit U1)

Figure 14:
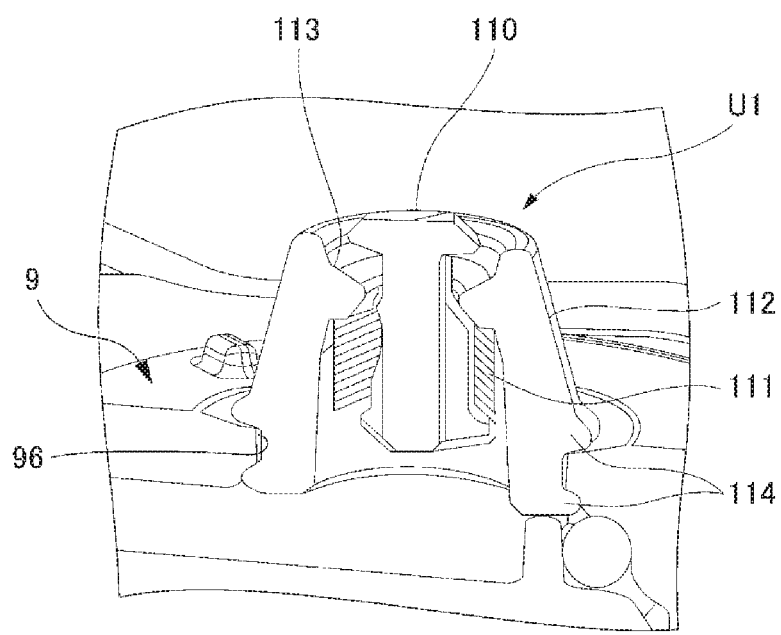
FIG. 14 is a cross-sectional perspective view of the lower attachment portion in a state in which the valve unit is connected.

FIG. 14 is a cross-sectional perspective view of the lower attachment portion in a state in which the valve unit U1 is connected.

The valve unit U1 enables the flow of gas G from the air supply member 50 to the internal space of the substrate storage container 1, but a check valve 110 is included so that the gas G in the internal space does not flow backward into the air supply member 50.

As shown in FIG. 14, the valve unit U1 includes a substantially cylindrical valve housing 112 having a valve seat 113, and a check valve 110 biased against the valve seat 113 by a coil spring 111. The check valve 110 and the valve housing 112 are formed of various materials having a predetermined elasticity, such as fluorocarbon resin, elastomer, and rubber.

While the above-described gas replacement units 3R and 3L are configured to blow out gas G uniformly between the stored substrates W, for the valve unit U1, when the pressure of the gas G supplied from the air supply member 50 overcomes the biasing force of the coil spring 111 and the check valve 110 is separated from the valve seat 113, the gas G is made to flow into the internal space of the substrate storage container 1, and is used such as when the uniformity of the gas G in the inner space is not important.

The valve unit U1 can be connected to the air supply member 50 by inserting the valve housing 112 into the insertion hole 96 of the offset member 9 and engaging it thereto with two flanges 114.

(Blocking Unit U2)

Figure 15A:
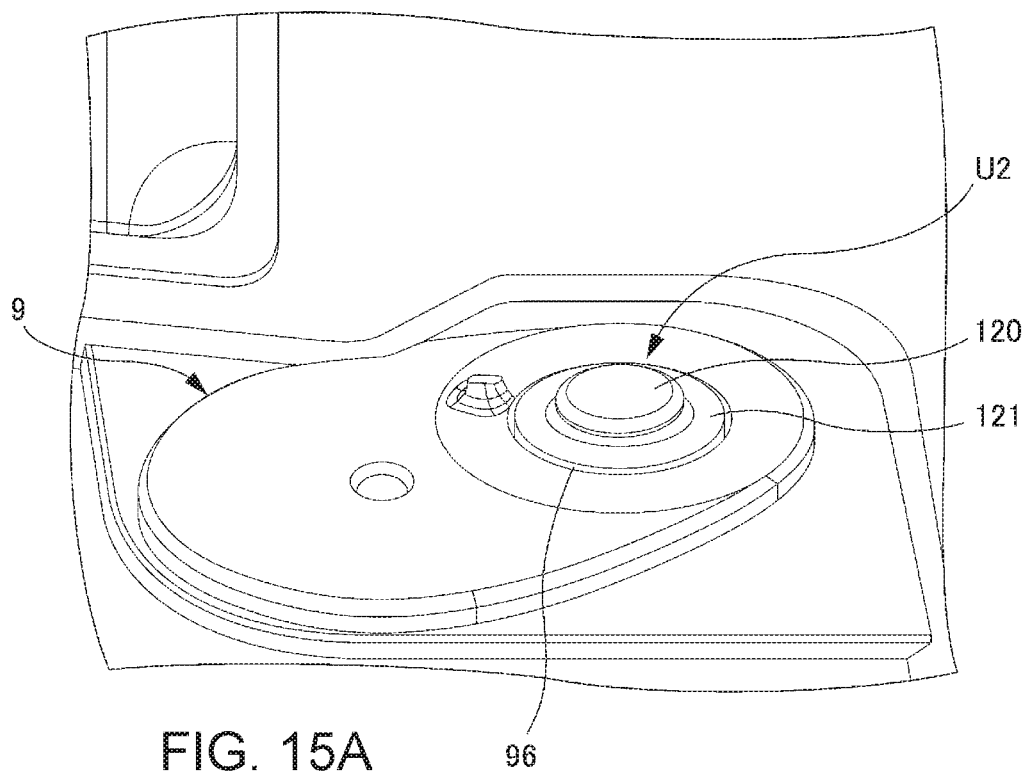
FIG. 15A is a perspective view of the lower attachment portion in a state in which the closing unit is connected.
Figure 15B:
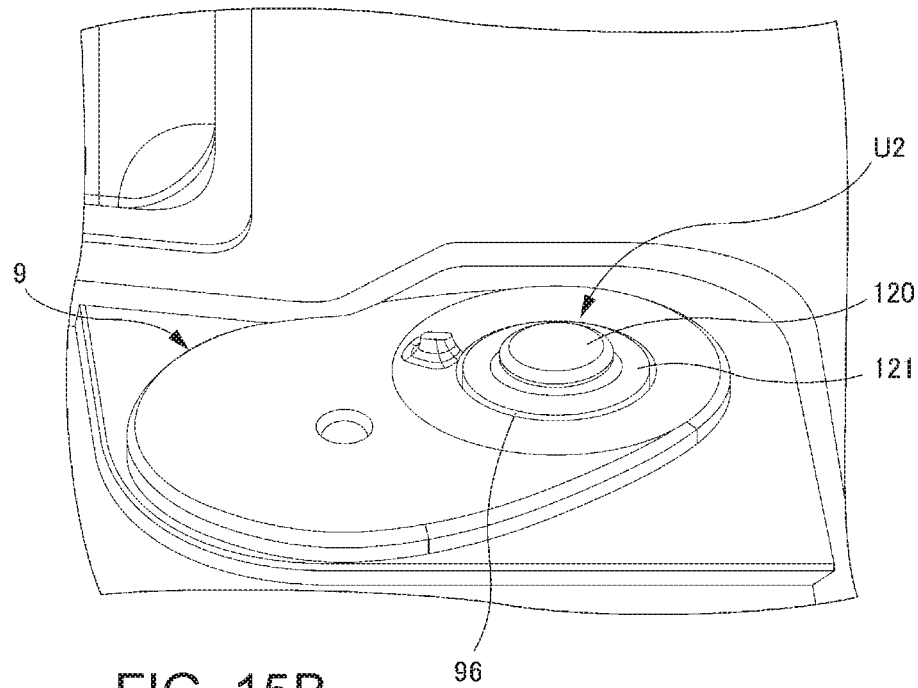
FIG. 15B is a cross-sectional perspective view.

FIG. 15(*a*) is a perspective view of the lower attachment portion in a state in which the blocking unit U2 is connected, and (*b*) is a cross-sectional perspective view.

The blocking unit U2 makes the flow of the gas G from the air supply member 50 to the internal space of the substrate storage container 1 impossible.

As shown in FIG. 15, the blocking unit U2 has a mushroom-shaped plug body 120 and a mounting hole 122 into which the rod portion of the plug body 120 is mounted, and a packing 121 is inserted into the insertion hole 96 and fitted and locked. The plug body 120 is formed of plastic resin or the like, and the packing 121 is formed of various materials having a predetermined elasticity, such as a fluorine resin, an elastomer, and rubber.

In order to connect the closing unit U2 to the air supply member 50, the packing 121 may be inserted into the insertion hole 96 of the offset member 9, fitted and locked, and the plug body 120 may be inserted into and attached to the mounting hole 122.

(Small Diameter Filter Unit U3)

Figure 16A:
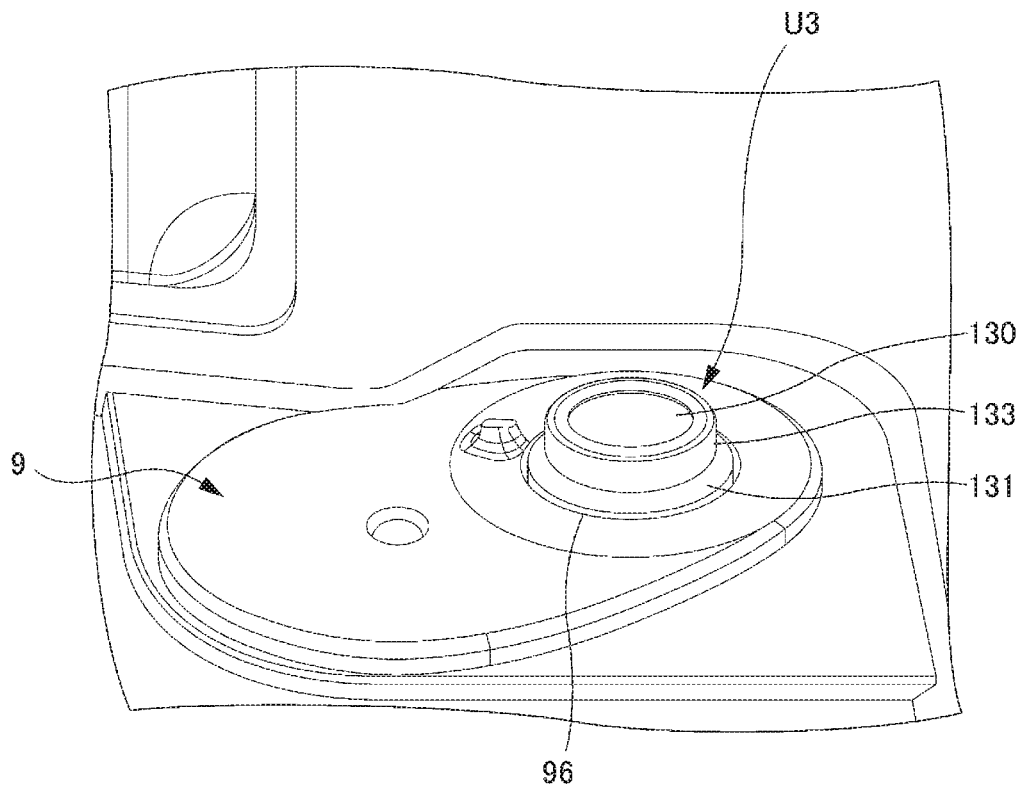
FIG. 16A is a perspective view of the lower attachment portion in the state where the small diameter filter unit is connected.
Figure 16B:
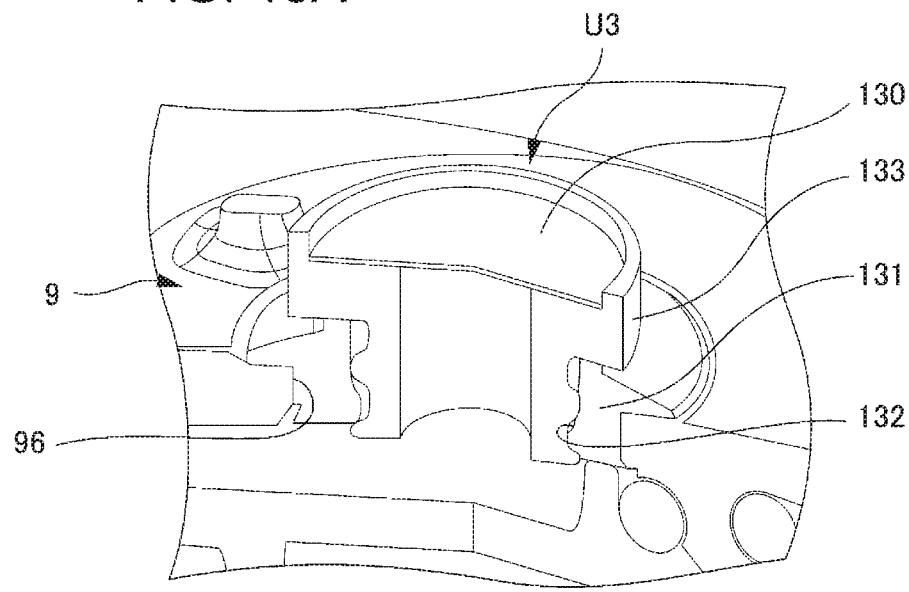
FIG. 16B is a cross-sectional perspective view.

FIG. 16A is a perspective view of the lower attachment portion in the state where the small diameter filter unit U3 is connected, and FIG. 16B is a cross-sectional perspective view.

The small diameter filter unit U3 includes a filter member 130 that purifies gas G supplied from the air supply member 50 to the internal space of the substrate storage container 1.

As shown in FIGS. 16A and 16B, the small diameter filter unit U3 is configured so as to have a breathable filter member 130, a two-stage cylindrical filter housing 133 having a large diameter cylindrical portion to which a filter member 130 is adhered or held and fixed, and a packing 131 which is inserted into the insertion hole 96 and fitted and locked and having a mounting hole 132 into which the small diameter cylindrical portion of the filter housing 133 is mounted. The filter housing 133 is formed of a plastic resin or the like, and the packing 131 is formed of various materials having a predetermined elasticity such as a fluorine resin, an elastomer, or a rubber. The filter member 130 is formed of a non-woven fabric filter or the like.

If the small diameter filter unit U3 is connected to the air supply member 50, the packing 131 may be inserted into the insertion hole 96 of the offset member 9, and fitted and locked, and the filter housing 133 may be inserted and mounted in the mounting hole 132. Note that even if the small diameter filter unit U3 supplies a gas G of about 10 L/min, since the passing pressure loss is small, even if connected only by the fitting, the fitting does not come off.

(Large Diameter Filter Unit U4)

Figure 17A:
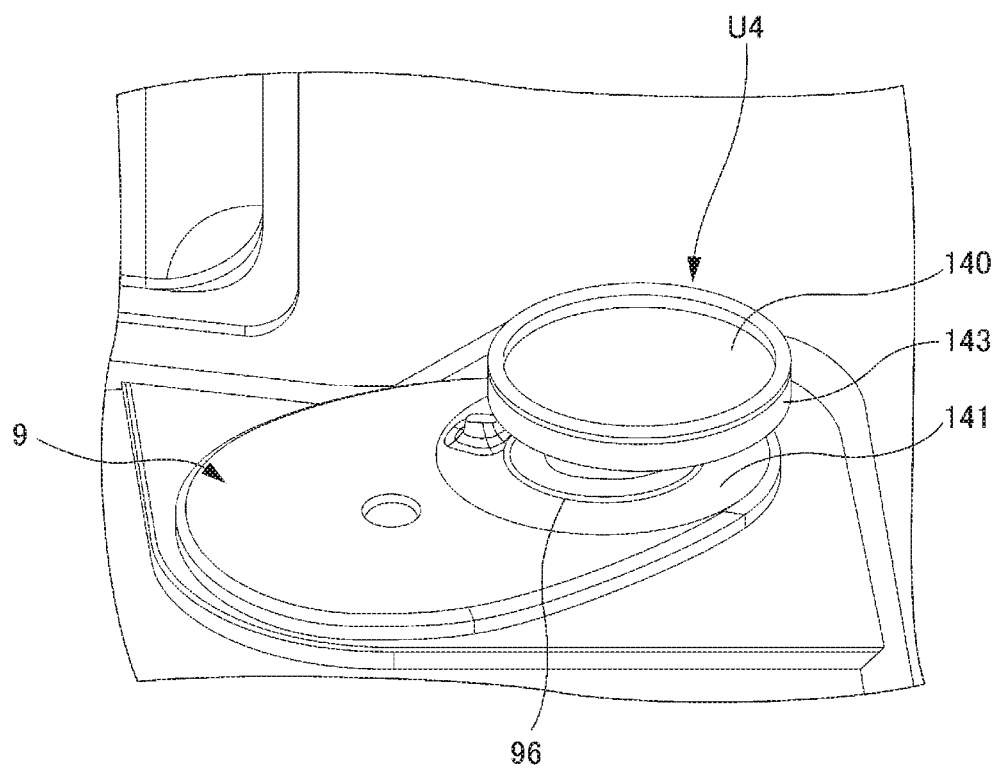
FIG. 17A is a perspective view of a lower attachment portion in a state where a large diameter filter unit is connected.
Figure 17B:
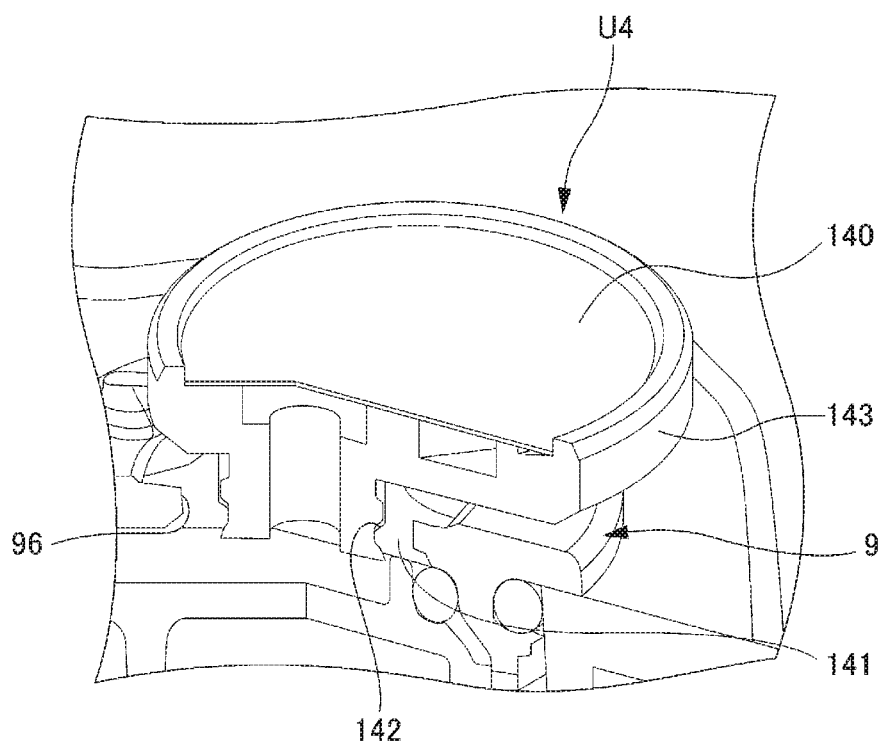
FIG. 17B is a cross-sectional perspective view.

FIG. 17A is a perspective view of a lower attachment portion in a state where a large diameter filter unit U4 is connected, and FIG. 17B is a cross-sectional perspective view.

The large diameter filter unit U4 like the small diameter filter unit U3 includes a filter member 140 for purifying gas G supplied from the air supply member 50 to the internal space of the substrate storage container 1.

As shown in FIGA. 17A and 17B, the large diameter filter unit U4 is configured so as to have a breathable filter member 140, a two-stage cylindrical filter housing 143 having a large diameter cylindrical portion to which a filter member 140 is adhered or held and fixed, a packing 131 which is inserted into the insertion hole 96 and fitted and locked and having a mounting hole 142 into which the small diameter cylindrical portion of the filter housing 143 is mounted. The filter housing 143 is formed of a plastic resin or the like, and the packing 141 is formed of various materials having a predetermined elasticity such as a fluorine resin, an elastomer, or a rubber. Further, the filter member 140 is formed of a non-woven fabric filter or the like.

If the large diameter filter unit U4 is connected to the air supply member 50, the packing 141 may be inserted into the insertion hole 96 of the offset member 9, fitted and locked, and the filter housing 143 may be inserted and mounted in the mounting hole 142. Note that since the area of the filter member 140 of the large diameter filter unit U4 is about four times larger than the area of the filter member 130 of the small diameter filter unit U3, even when, for example, a large amount of gas G of about 30 L/min is supplied, the passing pressure loss can be reduced.

While the above-described gas replacement units 3R and 3L are configured to blow out the gas G uniformly between the stored substrates W, the small diameter filter unit U3 and the large diameter filter unit U4 are used, for example, such as when the uniformity of the gas G in the internal space of the substrate storage container 1 is not important. Since the gas replacement units 3R and 3L include the filter members 34 and 35, they can be rephrased as filter units 3R and 3L.

As described above, the substrate storage container 1 according to an embodiment of the present invention comprises a container body 2 capable of storing a plurality of substrates W, and one or more air supply members 50 capable of supplying a gas G from the outside of the container body 2 to the internal space, wherein the container body 2 is formed into a front open box, and the one or more air supply members 50 are attached to the bottom surface 2*f*, and with regard to the one or more air supply members 50, functional units U that change the environment of the internal space to different states are connected so as to be able to be exchanged.

Thereby, since various functional units U can be attached to the air supply members 50, the functional units U can be easily attached or detached from the container body 2. Also when the container body 2 is cleaned, the functional unit U can be easily removed, and the inside of the container body 2 can be completely cleaned. Also, the removed functional unit U can be easily cleaned.

In the embodiments, an air supply member 50 has a filtration member 51 that filters the gas. Thereby, even when connecting a functional unit U which has no filter, blowing out a gas G containing dust from the functional unit U can be suppressed; moreover, in the case where functional units U which have filters such as the filter units of U2 and U3 are connected, dust can be doubly removed, and the filter replacement interval of the functional units U can be lengthened. Furthermore, a liquid such as a cleaning liquid used when cleaning the container body 2 can be prevented from entering by a hydrophobic filter member 51.

In the embodiments, the functional units U are the gas replacement units 3R, 3L and comprise a housing member 31 storing gas G supplied from an air supply member 50, a cover member 32 which covers the opening of the housing member 31, and blowout holes for blowing out a gas formed on a side of at least one of the housing member 31 and the cover member 32. Thus, the gas G blown out from the blowout holes of the gas replacement units 3R and 3L can flow toward the vicinity of the center of the container body 2, the side walls 2c and 2d, and the back wall 2b.

In an embodiment, the functional unit U is a valve unit U1 that includes a check valve 110 that enables gas G to flow to the internal space. Thus, such as when the uniformity of the gas G in the internal space of the substrate storage container 1 is not important, there is no need to use the gas replacement units 3R and 3L.

In an embodiment, the functional unit U is a blocking unit U2 that disables the flow of gas G to the internal space. Thus, the flow of gas G such as air between the internal space of the substrate storage container 1 and the external atmosphere through the air supply member 50 can be more reliably prevented.

In an embodiment, the functional units U are filter units U3 and U4 which include filter members for purifying a gas G supplied to the internal space. Thereby, even if dust is contained in the supplied gas G, because it can be captured by the filter members 130 and 140, dust does not blow out into the container body 2 and the internal space of the substrate storage container 1 is not contaminated.

In an embodiment, the gas G is nitrogen gas or dry air. Thereby, if a gas G is supplied to the internal space of the substrate storage container 1, the surface of the substrate W does not deteriorate since the internal space is maintained at an inert or low humidity.

(Modifications)

In the gas replacement units 3R, 3L of the embodiment, the opening area, number, and arrangement of the first group blowout holes 31a-z, the third group blowout holes 33a-z and the second group blowout holes 32a-f are not limited to the embodiment, and the amount of blown air blown downward may be increased so that it can oppose the air from the outside such as the downflow air blown along the upper surface of the bottom surface 2f.

Further, by selectively blocking or drilling the second group blowout holes 32a-f, the ratio of the blown air volume to the front F and the back B is able to be adjusted. Moreover, by changing the position of the recess 92 of the offset member 9, the direction of the gas replacement units 3R, 3L may be changed. Alternatively, the intersection angle of the two surfaces 31A, 31B of the housing member 31 may be changed, or the area may be changed to adjust the blowout direction and/or the ratio of the blowout airflow rate. These changes can be dealt with by using inserts in the molding die.

In addition, the housing member 31 may be positioned and fixed not at the upper portion but at the central portion, or may be positioned and fixed at the upper portion and the central portion. At this time, the position of the through hole formed in the rear wall 2b may be appropriately changed, and the shape of the position fixing member 8 is appropriately changed.

In the above embodiment, in addition to the gas replacement units 3R and 3L, a plurality of other gas replacement units may be provided, or alternatively, any one of the gas replacement units 3R and 3L may be used. In addition, the gas replacement units 3R, 3L are not limited to the two positions on the left and right sides at the back B, and may be arranged in the region of the center of the back B if there is a region in that area that does not interfere with the substrates W.

Although the preferred embodiments of the present invention have been described in detail above, the present invention is not limited to the above-described embodiments, and various modifications and changes are possible within the scope of the gist of the present invention described in the claims.

The invention claimed is:

1. A substrate storage container comprising:
    a container body configured to contain a plurality of substrates;
    an air supply duct located at a bottom of the container body to supply gas from outside of the container body to an internal space;
    an offset member attached to an attachment hole formed in the bottom of the container body; and
    a functional unit configured to change environment of the internal space,
    wherein the container body is formed in a front open box,
    wherein the offset member comprises an offset plate having a concave portion where the air supply duct is fitted and an offset plate presser having an insertion hole where the functional unit is fitted,
    wherein the offset plate is attached to the attachment hole from the outside of the container body and the offset plate presser is attached to the attachment hole from an inside of the container body so as to form a flow path between the offset plate and the offset plate presser through which the gas flows along the bottom of the container body, and
    wherein the functional unit is connected with the air supply duct through the offset member so as to be replaceable, and
    the functional unit is one of the following:
        a gas replacement unit including a housing to store the gas supplied through the air supply duct and blowout holes to blow out the gas, and configured to replace air in the internal space with the gas;
        a valve unit including a check valve that prevents backflow of the gas into the air supply duct while allowing the gas to flow into the internal space;
        a blocking unit including a plug that blocks a flow of the gas from the air supply duct to the internal space; or
        a filter unit including a filter that purifies the gas supplied to the internal space.

2. The substrate storage container according to claim 1, wherein the air supply duct has a filter that filters the gas.

3. The substrate storage container according to claim 1, wherein the functional unit is the gas replacement unit, which further comprises:
    a cover that covers an opening of the housing member, and
    the blowout holes are formed in at least one of the housing and the cover.

4. The substrate storage container according to claim 1, wherein the functional unit is the valve unit, which further comprises a valve housing having two flanges on an outer surface thereof and a coil spring that biases the check valve toward a valve seat of the valve housing, and
    the valve unit is fitted and engaged in the insertion hole formed in the offset plate presser as the offset plate presser is held between the two flanges.

5. The substrate storage container according to claim 1, wherein the gas is nitrogen gas or dry air.

6. The substrate storage container according to claim 1, wherein the air supply duct has a check valve.

* * * * *